United States Patent
Hwang et al.

(10) Patent No.: US 8,609,515 B2
(45) Date of Patent: Dec. 17, 2013

(54) DICING DIE BONDING FILM, SEMICONDUCTOR WAFER, AND SEMICONDUCTOR DEVICE

(75) Inventors: Min Kyu Hwang, Uiwang-si (KR); Ji Ho Kim, Uiwang-si (KR); Ki Tae Song, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 13/287,367

(22) Filed: Nov. 2, 2011

(65) Prior Publication Data

US 2012/0171844 A1    Jul. 5, 2012

(30) Foreign Application Priority Data

Dec. 29, 2010   (KR) .......................... 10-2010-0138350

(51) Int. Cl.
*H01L 21/78* (2006.01)
(52) U.S. Cl.
USPC ................... 438/465; 257/798; 257/E21.599; 428/343; 428/349; 428/355 EP; 438/976
(58) Field of Classification Search
USPC ................... 257/798, E21.599; 428/343, 349, 428/355 EP; 438/465, 976
See application file for complete search history.

(56) References Cited

U.S. PATENT DOCUMENTS

| | | | |
|---|---|---|---|
| 6,379,791 B1 * | 4/2002 | Cernohous et al. | ........ 428/355 R |
| 2005/0208296 A1 * | 9/2005 | Saiki et al. | ..................... 428/343 |
| 2007/0003758 A1 | 1/2007 | Jin | |
| 2009/0162650 A1 | 6/2009 | Hong et al. | |
| 2009/0246915 A1 | 10/2009 | Ichikawa et al. | |

FOREIGN PATENT DOCUMENTS

| | | |
|---|---|---|
| CN | 101463245 A | 6/2009 |
| JP | 2007-035852 A | 2/2007 |
| JP | 2008-060580 A | 3/2008 |
| JP | 2009-242605 A | 10/2009 |

OTHER PUBLICATIONS

Chinese Office Action in CN 201110331571.X, dated Apr. 28, 2013 (Hwang, et al.).
Korean Office Action in KR 10-2010-0138350, dated Jun. 24, 2013 (Hwang, et al.).

* cited by examiner

*Primary Examiner* — Asok K Sarkar
(74) *Attorney, Agent, or Firm* — Lee & Morse, P.C.

(57) ABSTRACT

A dicing die bonding film including a bonding layer; and a pressure-sensitive adhesive layer adjoining the bonding layer, the pressure-sensitive adhesive layer having a storage modulus of about 400 to about 600 kPa at 25° C. and a peel strength of about 200 to about 350 mN/25 mm with respect to the bonding layer as measured according to KS-A-01107 standard.

11 Claims, 1 Drawing Sheet

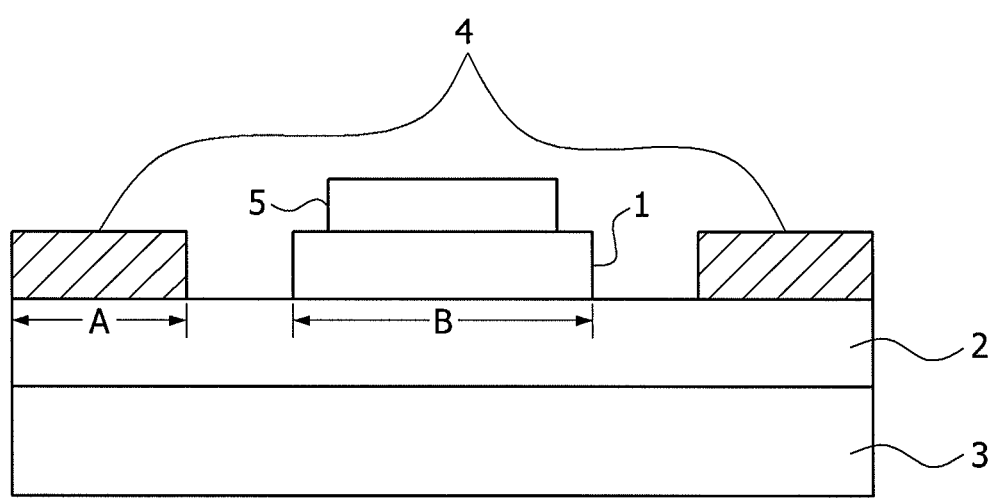

DICING DIE BONDING FILM, SEMICONDUCTOR WAFER, AND SEMICONDUCTOR DEVICE

BACKGROUND

1. Field

Embodiments relate to a dicing die bonding film, a semiconductor wafer, and a semiconductor device.

2. Description of the Related Art

In a semiconductor manufacturing process, a circuit designed wafer may be back-ground and laminated with a dicing tape or dicing die bonding tape, followed by cutting the wafer into small chips through dicing. Then, the separate chips may be bonded to a substrate, e.g., a PCB or lead frame substrate, through a bonding process. For example, the semiconductor manufacture process may include a back grinding process (in which the wafer is thinned), a mounting process (in which a dicing tape or dicing die bonding tape is mounted on a rear side of the wafer), a dicing process (in which the mounted wafer is cut into, e.g., a uniform size of, pieces), a UV irradiation process (in which UV light is irradiated to the tape), a pick-up process (in which each chip is picked up), and a die bonding process (in which the chip is bonded to a support member). The dicing tape may be attached to the rear side of the wafer in the mounting process, thereby preventing vibration of the wafer, securely supporting the wafer, and reducing or preventing formation of cracks on the chips or on lateral sides of the chips due to a blade used in the dicing process. Further, a dicing film may be expanded in the die bonding process to facilitate pick-up.

The dicing tape may be a pressure-sensitive adhesive dicing tape or a UV-curable dicing tape. The UV-curable dicing tape may be used to make a wafer thin and to pick up various sizes of chips.

When dicing is completed, UV light may be irradiated from a back side of the UV-curable dicing tape to cure an adhesive layer and to decrease interfacial peel strength with respect to the wafer, thereby facilitating a pick-up process of separate chips. In order to package the separate chips after dicing so that electric signals may be applied to the chips, a process of bonding the chips to a substrate, e.g., a PCB or lead frame substrate, may be used. For example, a liquid epoxy resin may be placed onto the substrate, and the separate chips may be attached thereto to be bonded to the substrate. This two-stage process, in which the dicing process uses the dicing tape and the die bonding process uses the liquid epoxy resin, may incur undesirable costs and poor yield.

Methods utilizing a dicing die bonding film may be used. In these methods, an epoxy film may be placed on a film provided as a dicing tape, and pick-up may be conducted between a pressure-sensitive adhesive of the dicing tape and the epoxy film, thereby combining the two-stage process into a single stage process. In this regard, these methods may be advantageous in terms of time and yield.

As multi-layer structure and high integration are realized in a semiconductor process, a wafer may become thinner. When thin wafer chips are picked up, the wafer may bend and the chips may be damaged by minor external impact. Thus, it may be important for equipment adjustment parameters for pick-up of pick-up/die bonding equipment to be in a lower level than in pick-up of an existing thick-film wafer. The equipment adjustment parameters for pick-up of the pick-up/die bonding equipment may include an expanding extent, the number of pins, a pin elevation height, a pin elevation rate, decompression pressure, the kind of collet, and the like. For example, a pin elevation height and a pin elevation rate may be key parameters in adjustment of pick-up, but these two factors may be adjusted within substantially limited ranges for thin chips. When a pin elevation height increases to facilitate pick-up, a thin chip may crack or may be damaged, causing reliability deterioration after packaging. Thus, in order to facilitate pick-up of a thin wafer (having a thickness of 80 μm or less), a dicing tape should have remarkably low peel strength with respect to the wafer after UV curing, as compared with a dicing tape used to pick up a thicker wafer.

For this reason, a UV-curable dicing tape may be considered. However, the UV-curable dicing tape may be unfavorable in terms of long processing time and high costs for a UV process. In order to reduce the processing time and costs, a pressure-sensitive adhesive dicing tape may be considered. However, a pressure-sensitive adhesive dicing tape may cause detachment of a ring frame or creeping of wafer chips during a dicing process when the dicing tape has low adhesive strength to the ring frame.

SUMMARY

Embodiments are directed to a dicing die bonding film, a semiconductor wafer, and a semiconductor device.

The embodiments may be realized by providing a dicing die bonding film including a bonding layer; and a pressure-sensitive adhesive layer adjoining the bonding layer, the pressure-sensitive adhesive layer having a storage modulus of about 400 to about 600 kPa at 25° C. and a peel strength of about 200 to about 350 mN/25 mm with respect to the bonding layer as measured according to KS-A-01107 standard.

The pressure-sensitive adhesive layer may be formed by heat curing.

The pressure-sensitive adhesive layer may have a peel strength of about 150 to about 300 mN/25 mm with respect to a ring frame, as measured according to KS-A-01107 standard.

The pressure-sensitive adhesive layer may not include a photo-initiator.

The pressure-sensitive adhesive layer may include a binder resin and a heat curing agent.

The pressure-sensitive adhesive layer may further include a silane coupling agent.

The binder resin may have a weight average molecular weight of about 150,000 to about 700,000 g/mol.

The binder resin may have a glass transition temperature of about −55 to about −30° C.

The binder resin may not include a vinyl group after polymerization.

The binder resin may be a copolymer of an alkyl (meth)acrylate, a hydroxyl group-containing (meth)acrylate, and an epoxy group-containing (meth)acrylate.

The copolymer may include about 60 to about 85 wt % of repeating units of the alkyl (meth)acrylate, about 10 to about 35 wt % of repeating units of the hydroxyl group-containing (meth)acrylate, and about 1 to about 10 wt % of repeating units of the epoxy group-containing (meth)acrylate.

The heat curing agent may be included in an amount of about 3 to about 10 parts by weight, based on 100 parts by weight of the binder resin.

The embodiments may also be realized by providing a semiconductor wafer including thereon the dicing die bonding film according to an embodiment, the bonding layer of the dicing die bonding film being attached to one side of the wafer, and the pressure-sensitive adhesive layer of the dicing die bonding film being fixed to a wafer ring frame.

The embodiments may also be realized by providing a semiconductor device, the semiconductor device being formed by attaching the dicing die bonding film as claimed in claim 1 to a wafer such that the bonding layer of the dicing die bonding film is attached to the wafer, dicing the wafer into semiconductor chips, and picking up one of the semiconductor chips to form the semiconductor device such that the semiconductor device includes the semiconductor chip mounted on the bonding layer.

The embodiments may also be realized by providing a dicing die bonding film including a bonding layer; and a pressure-sensitive adhesive layer adjoining the bonding layer, the pressure-sensitive adhesive including a copolymer consisting essentially of a C2 to C20 alkyl (meth)acrylate, a hydroxyl group-containing (meth)acrylate, and an epoxy group-containing (meth)acrylate.

The copolymer may include about 60 to about 85 wt % of repeating units of the C2 to C20 alkyl (meth)acrylate, about 10 to about 35 wt % of repeating units of the hydroxyl group-containing (meth)acrylate, and about 1 to about 10 wt % of repeating units of the epoxy group-containing (meth)acrylate.

BRIEF DESCRIPTION OF THE DRAWING

The embodiments will become apparent to those of ordinary skill in the art by describing in detail exemplary embodiments with reference to the attached drawing, in which:

FIG. 1 illustrates a sectional view of a dicing die bonding film according to an embodiment.

DETAILED DESCRIPTION

Korean Patent Application No. 10-2010-0138350, filed on Dec. 29, 2010, in the Korean Intellectual Property Office, and entitled: "Dicing Die Bonding Film," is incorporated by reference herein in its entirety.

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing FIGURE, the dimensions of layers and regions may be exaggerated for clarity of illustration. It will also be understood that when a layer or element is referred to as being "on" another layer or substrate, it can be directly on the other layer or substrate, or intervening layers may also be present. Like reference numerals refer to like elements throughout.

Herein, the content of each component will be described in terms of solid content, unless mentioned otherwise. Further, unless defined otherwise, the term "(meth)acrylate" may collectively refer to both "acrylate" and "methacrylate." In addition, the term "(meth)acrylic acid" may collectively refer to both "acrylic acid" and "methacrylic acid." In addition, the term "(meth)acrylamide" may collectively refer to both "acrylamide" and "methacrylamide."

An embodiment provides a dicing die bonding film. The dicing die bonding film may include, e.g., a bonding layer and a pressure-sensitive adhesive layer adjoining the bonding layer. The pressure-sensitive adhesive layer may have a storage modulus of about 400 to about 600 kPa at 25° C. In an implementation, the pressure-sensitive adhesive layer may have a storage modulus of about 410 to about 590 kPa at 25° C. Within this range, excellent processability in a dicing process may be obtained, and detachment from the bonding layer after dicing may be facilitated.

FIG. 1 illustrates a sectional view of a pressure-sensitive type dicing die bonding film according to an embodiment. The dicing die bonding film may have a structure in which a pressure-sensitive adhesive layer 2 is deposited on a base film 3, and a bonding layer 1 may then be stacked on the pressure-sensitive adhesive layer 2. A semiconductor chip 5 may be attached to an upper side of the bonding layer 1. When the chip is picked up after dicing into small pieces, the bonding layer 1 attached to a rear side of the chip 5 may be easily separated from the lower pressure-sensitive adhesive layer 2 and die-bonded to a surface of a support member, e.g., a PCB or a lead frame (not illustrated).

A peel strength (B) of the pressure-sensitive adhesive layer 2 with respect to the bonding layer 1 may be about 200 to about 350 mN/25 mm. Further, a peel strength (A) of the pressure-sensitive adhesive layer 2 with respect to a ring frame 4 may be about 150 to about 300 mN/25 mm. With the peel strength (A) and the peel strength (B) within these ranges, stable adhesive strength may be secured on the ring frame 4, and pick-up may be favorably conducted in sawing and die attach processes.

Herein, the peel strengths may be measured in accordance with Section 8 of Korean Industrial Standards, KS-A-01107 (Testing method for pressure-sensitive adhesive tapes and sheets). With the pressure-sensitive adhesive layer attached to a substrate, a specimen may be pressed one time by reciprocating a pressing roller having a weight of 2 kg at a speed of about 300 mm/min thereon. About 30 minutes after pressing, a folded portion of the specimen may be turned over about 180°, and 25 mm of the specimen may be peeled. Then, the specimen may be fixed to an upper clip of a tension tester, and the die-attach adhesive film may be fixed to a lower clip of the tension tester, followed by measuring load (mN/25 mm) when peeling, while drawing at a tensile speed of about 300 mm/min. An Instron Series IX/s Automated Materials Tester-3343 may be used as the tension tester.

Herein, the "substrate" may refer to a bonding layer or a ring frame. The peel strength of the pressure-sensitive adhesive layer with respect to the bonding layer may be measured when the substrate is the bonding layer, and the peel strength of the pressure-sensitive adhesive layer with respect to the ring frame may be measured when the substrate is the ring frame.

In an implementation, the pressure-sensitive adhesive layer may have a peel strength of about 200 to about 350 mN/25 mm with respect to the bonding layer, as measured according to KS-A-01107, and may have a peel strength of about 150 to about 300 mN/25 mm with respect to the ring frame, as measured according to KS-A-01107. Within this range, picking-up may be easily conducted in sawing and die-bonding processes.

In an implementation, the pressure-sensitive adhesive layer may include a binder resin and a heat curing agent.

Binder Resin

According to an embodiment, acrylic binders may be used as the binder resin.

The binder resin may have a weight average molecular weight of about 150,000 to about 700,000 g/mol. Within this range, excellent coating formability may be obtained. In an implementation, the binder resin may have a weight average molecular weight of about 500,000 to about 700,000 g/mol. Within this range, excellent coating properties may be obtained.

The binder resin may have a viscosity of about 1,500 to about 3,500 cps at about 25° C. Within this range, excellent coating properties may be obtained. In an implementation, the binder resin may have a glass transition temperature of about −55° C. to about −30° C.

The binder resin may not include a vinyl group after polymerization.

A monomer constituting the binder resin may have a glass transition temperature of about −55 to about −30° C., e.g., the monomer may be polymerized to form a polymer having a glass transition temperature of about −55 to about −30° C. In an implementation, the binder resin may be a copolymer of an alkyl (meth)acrylate, a hydroxyl group-containing (meth) acrylate, and an epoxy group-containing (meth)acrylate.

The alkyl (meth)acrylate may include C2 to C20 alkyl (meth)acrylates. Examples of the alkyl (meth)acrylate may include 2-ethylhexyl (meth)acrylate, isooctyl (meth)acrylate, ethyl acrylate, n-butyl acrylate, and octadecyl methacrylate. For example, alkyl (meth)acrylates having a glass transition temperature of about −55 to about −30° C. may be used, e.g., alkyl (meth)acrylates that polymerize to form a polymer having a glass transition temperature of about −55 to about −30° C. may be used. Within this range, excellent tack may be obtained at room temperature. The alkyl (meth)acrylates may be used alone or in a combination of two or more thereof. Repeating units of the alkyl (meth)acrylate may be present in the copolymer an amount of about 60 to about 85 wt %, e.g., about 65 to about 80 wt %. Within this range, excellent tack at room temperature and excellent peel strength with respect to an adhesive, e.g., a bonding layer, may be obtained.

Examples of the hydroxyl group-containing (meth)acrylate may include 2-hydroxyethyl (meth)acrylate, 4-hydroxybutyl (meth)acrylate, 2-hydroxypropyl (meth)acrylate, 2-hydroxybutyl (meth)acrylate, 6-hydroxyhexyl (meth)acrylate, 1,4-cyclohexanedimethanol mono(meth)acrylate, 1-chloro-2-hydroxypropyl (meth)acrylate, diethylene glycol mono (meth)acrylate, 1,6-hexanediol mono(meth)acrylate, pentaerythritol tri(meth)acrylate, dipentaerythritol penta(meth) acrylate, neopentylglycol mono(meth)acrylate, trimethylolpropane di(meth)acrylate, trimethylolethane di(meth)acrylate, 2-hydroxy-3-phenyloxypropyl (meth) acrylate, 4-hydroxycyclohexyl (meth)acrylate, 2-hydroxy-3-phenyloxy (meth)acrylate, and cyclohexane dimethanol mono(meth)acrylate. For example, hydroxyl group-containing (meth)acrylates having a glass transition temperature of about −55 to about −30° C. may be used, e.g., hydroxyl group-containing (meth)acrylates that polymerize to form a polymer having a glass transition temperature of about −55 to about −30° C. may be used. Within this range, excellent tack may be obtained at room temperature. The hydroxyl group-containing (meth)acrylates may be used alone or in a combination of two or more thereof. Repeating units of the hydroxyl group-containing (meth)acrylate may be present in the copolymer an amount of about 10 to about 35 wt %, e.g., about 15 to about 30 wt %. Within this range, excellent tack may be obtained at room temperature and excellent peel strength with respect to an adhesive, e.g., a bonding layer, may be exhibited.

Examples of the epoxy group-containing (meth)acrylate may include glycidyl acrylate and glycidyl methacrylate. For example, epoxy group-containing (meth)acrylates having a glass transition temperature of about −55 to about −30° C. may be used, e.g., epoxy group-containing (meth)acrylates that polymerize to form a polymer having a glass transition temperature of about −55 to about −30° C. may be used. Within this range, excellent tack may be obtained at room temperature. The epoxy group-containing (meth)acrylates may be used alone or in a combination of two or more thereof. Repeating units of epoxy group-containing (meth)acrylate may be present in the copolymer in an amount of about 1 to about 10 wt %, e.g., about 3 to about 8 wt %. Within this range, excellent tack may be obtained at room temperature and excellent peel strength with respect to an adhesive may be obtained.

In an implementation, the binder resin may be a copolymer including about 60 to about 85 wt % of repeating units of the alkyl (meth)acrylate, about 10 to about 35 wt % of repeating units of the hydroxyl group-containing (meth)acrylate, and about 1 to about 10 wt % of repeating units of the epoxy group-containing (meth)acrylate. For example, the binder resin may be a copolymer including about 50 to about 80 wt % of repeating units of 2-ethylhexyl acrylate, about 5 to about 20 wt % of repeating units of isooctyl acrylate, about 10 to about 30 wt % of repeating units of a hydroxyl group-containing (meth)acrylate, and about 1 to about 10 wt % of repeating units of glycidyl (meth)acrylate.

The binder resin may have a glass transition temperature of about −55 to about −30° C. Within this range, excellent tack may be obtained at room temperature.

The binder resin may be prepared by any suitable copolymerization method known in the art. For example, the binder resin may be prepared by emulsion polymerization, suspension polymerization, bulk polymerization, or the like. For polymerization, a polymerization initiator including, e.g., azobisisobutyronitrile or the like, may be used.

Heat Curing Agent

The pressure-sensitive adhesive layer may be formed by heat curing. Thus, the pressure-sensitive adhesive layer may include a heat curing agent. In an implementation, the pressure-sensitive adhesive layer may not include a photo-initiator.

Examples of suitable heat curing agents may include isocyanate, epoxy, aziridine, melamine, amine, imide, carbodiimide, and amide compounds. For example, isocyanate heat curing agents may be used. Examples of the isocyanate heat curing agents may include 2,4-trilene diisocyanate, 2,6-trilene diisocyanate, hydrogenated trilene diisocyanate, 1,3-xylene diisocyanate, 1,4-xylene diisocyanate, diphenylmethane-4,4-diisocyanate, 1,3-bis(isocyanatomethyl) cyclohexane, tetramethylxylene diisocyanate, 1,5-naphthalene diisocyanate, 2,2,4-trimethyl-hexamethylene diisocyanate, trilene diisocyanate adducts of trimethylolpropane, xylene diisocyanate adducts of trimethylolpropane, triphenylmethane triisocyanate, methylene bis(triisocyanate), and the like.

The heat curing agent may be present in an amount of about 3 to about 10 parts by weight, based on 100 parts by weight of the binder resin. In an implementation, the heat curing agent may be present in an amount of about 5 to about 7 parts by weight, based on 100 parts by weight of the binder resin. Within this range, desired tack may be obtained to increase pick-up success rate, and high initial tack may be obtained to prevent cut chips from scattering during a sawing process or detachment of a ring frame.

In an implementation, the pressure-sensitive adhesive layer may further include a silane coupling agent. When the silane coupling agent is included, excellent stability between the ring frame and the pressure-sensitive adhesive layer may be obtained when mounting a wafer on the dicing die bonding film and dicing. Furthermore, it is possible to secure stability between the ring frame and the pressure-sensitive adhesive film without additional processing of the ring frame, and to exhibit creep properties in a similar level to a UV curable film.

The silane coupling agent may be present in an amount of about 0.1 to about 5 parts by weight, e.g., about 0.2 to about 2 parts by weight, based on 100 parts by weight of the binder resin.

Examples of the silane coupling agent may include epoxy silane, mercapto silane, amino silane, vinyltrichlorosilane, vinyltrimethoxysilane, 3-glycidoxypropyltrimethoxysilane, 3-methacryloxypropyltrimethoxysilane, 2-aminoethyl-3-aminopropylmethyldimethoxysilane, and 3-ureidopropyltriethoxysilane.

The pressure-sensitive adhesive layer may be formed by coating or transferring to a base film. Thus, a pressure-sensitive adhesive layer composition for forming the pressure-sensitive adhesive layer may include a solvent. Any suitable solvent, e.g., methyl ethyl ketone, may be used. The solvent may be present in an amount of about 50 to about 500 parts by weight, based on 100 parts by weight of solids of the pressure-sensitive adhesive layer composition.

The base film may be formed of various polymer films, e.g., a thermoplastic plastic film. Expanding may be conducted for picking-up after a dicing process, and remaining chips after expanding may be picked up again after a predetermined period of time. Thus, the thermoplastic film may be desirable in view of restoration force. Examples of polymers for the base film may include polyethylene, polypropylene, an ethylene/propylene copolymer, polybutene-1, an ethylene/vinyl acetate copolymer, a polyethylene/styrene-butadiene rubber mixture, and polyolefin films such as polyvinyl chloride, and the like. In an implementation, polymers, such as polyethylene terephthalate, polycarbonate, and poly(methyl methacrylate), thermoplastic elastomers, such as polyurethane and a polyimide-polyol copolymer, and mixtures thereof may be used for the base film. The base film may have a thickness of about 30 to about 300 μm, e.g., about 50 to about 200 μm, to have a high elongation rate and workability.

The pressure-sensitive adhesive layer may be formed on the base film by direct coating or may be transferred thereto after coating and drying on a release film. The pressure-sensitive adhesive layer may be formed by any coating method that forms a uniform layer, e.g., bar coating, gravure coating, comma coating, reverse-roll coating, applicator coating, spraying, dip coating, and the like. The pressure-sensitive adhesive layer may have a thickness of about 3 to about 40 μm, e.g., about 3 to about 30 μm. In an implementation, the pressure-sensitive adhesive layer may be a single layer.

The bonding layer 1 on the pressure-sensitive adhesive layer 2 may be formed of a heat-curable composition in a film and may exhibit excellent adhesion to a ground back side of a wafer. The bonding layer 1 may include an acrylic copolymer having a high molecular weight and good film formability, a heat-curable resin including an epoxy resin, and a curing agent. For example, the acrylic copolymer may include an acrylic rubber that is a copolymer of acrylic acid ester or methacrylic acid ester and acrylonitrile. Any suitable epoxy resin that is curable to have adhesion may be used, e.g., bisphenol-A epoxy resins, phenol novolac epoxy resins, and cresol novolac epoxy resins, which may be advantageous due to the presence of least two functional groups for a curing reaction. The curing agent may include any suitable curing agent generally used in preparation of bonding layers.

Further, the bonding layer 1 may include a curing accelerator to help cure the epoxy resin. For example, imidazole or amine curing accelerators may be used. In an implementation, the bonding layer 1 may include at least one kind of silane coupling agent to help enhance adhesion to the wafer.

The bonding layer may also be formed by any suitable coating method that forms a uniform layer. The bonding layer may have a thickness of about 5 to about 100 μm, e.g., about 10 to about 80 μm.

Another embodiment provides a semiconductor wafer. The semiconductor wafer may include the bonding layer of the dicing die bonding film attached to one side of the wafer and the pressure-sensitive adhesive layer of the dicing die bonding film fixed to a wafer ring frame.

The semiconductor wafer may be manufactured by laminating the bonding layer of the dicing die bonding film on a rear side of the semiconductor wafer and fixing the pressure-sensitive adhesive layer to the wafer ring frame.

Another embodiment provides a semiconductor device. The semiconductor device may include the bonding layer of the dicing die bonding film and semiconductor chips mounted on the bonding layer. The bonding layer may include the semiconductor chips mounted on one side thereof, and may be attached at another side thereof to a substrate, e.g., a PCB or lead frame substrate. Alternatively, the bonding layer may include other semiconductor chips mounted on the other side thereof.

The semiconductor device may be fabricated by any suitable method known in the art. In an implementation, a semiconductor wafer (having the dicing die bonding film attached thereto) may be cut into separate chips by a dicing device. The chips may be mounted on a substrate or another chip. The pressure-sensitive adhesive layer and the bonding layer may be separated from each other, so that only the bonding layer is attached to the chips.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

EXAMPLES

Preparative Examples 1 to 3 and 5

Preparation of Heat Curable Binder Resin 500 g of ethyl acetate as an organic solvent was added to a 2 L four-neck flask equipped with a reflux condenser at one side, a thermometer at another side, and a dropping funnel at a third side. After heating the solution in the flask to reflux (77~78° C.), a mixture solution was prepared by mixing 600 g of a monomer mixture including monomers according to compositions listed in Table 1 with 0.15 g of azobisisobutyronitrile and was dripped to the flask using the dropping funnel at 77 to 88° C. for 3 hours. The mixture solution was dripped while stirring at 200 rpm. After completion of dripping, the reactant was aged at 80 to 88° C. for 4 hours, 150 g of ethyl acetate and 0.15 g of azobisisobutyronitrile were added to the reactant for 20 minutes and left for 4 hours, followed by measuring viscosity and solid content and terminating the reaction, thereby preparing an acrylic adhesive polyol binder resin (LB-1 to LB-3 and LB 5) as an acrylic copolymer. The polymerized product had a viscosity of 1,500 to 3,500 cps/25° C. and a solid content of 40%.

Preparation Example 4

Preparation of Photocurable Binder Resin 240 g of 2-isocyanatoethyl methacrylate and 30 ppm of DBTDL were mixed with the acrylic adhesive polyol binder resin produced in Preparative Example 1 and reacted at 50 to 55° C. for 8 hours while stirring at 300 rpm. At a reaction end point (when an isocyanate group of the 2-isocyanatoethyl methacrylate monomer reacted with a hydroxyl group of the binder and disappeared on FT-IR), ethyl acetate was added to the reactant, followed by cooling, thereby synthesizing a photocurable acrylic adhesive binder having a solid content of 45%. (LB-4)

rpm for 30 minutes and filtered using a 200-mesh filter. The filtered adhesive composition was deposited on Toyobo TS-002 (38 μm-thick release PET) to a thickness of 20 μm using an applicator to prepare a bonding film. The bonding film was dried at 100° C. for 20 minutes and left at room temperature for 1 day.

TABLE 1

|  | Preparative Example 1 LB-1 | Preparative Example 2 LB-2 | Preparative Example 3 LB-3 | Preparative Example 4 LB-4 | Preparative Example 5 LB-5 |
|---|---|---|---|---|---|
| 2-EHA | 390 | 390 | 390 | 390 | 390 |
| IOA | 60 | 60 | 60 | 60 | 60 |
| 2-HEMA | 60 | 120 | — | 60 | 60 |
| 2-HEA | 60 | — | 120 | 60 | 60 |
| GMA | 30 | 30 | 30 | 30 | 30 |
| MMA |  |  |  |  | 90 |
| Isocyanatoethyl Methacrylate | — | — | — | 240 | — |

(Unit: g)
2-EHA: 2-ethylhexyl acrylate
IOA: Isooctyl acrylate
2-HEMA: 2-hydroxymethyl methacrylate
2-HEA: 2-hydroxy ethylacrylate
GMA: Glycidyl methacrylate
MMA: Methyl methacrylate Examples 1 to 6 and Comparative Examples 1 to 4

Preparation of Pressure-Sensitive Adhesive Layer

A heat curing agent was added to each of the binder resins prepared in Preparative Examples 1 to 5 according to compositions listed in Table 2 and stirred over 1 hour to prepare a pressure-sensitive adhesive composition. Methyl ethyl ketone was used as a solvent to prepare a 25% pressure-sensitive adhesive composition. The pressure-sensitive adhesive composition was deposited on one side of a 100 μm polyolefin film and dried at 80° C. for 2 minutes, thereby preparing a pressure-sensitive adhesive layer having a thickness of 10 μm, which was aged at 40° C. for 5 days.

The pressure-sensitive adhesive layer and the bonding layer were laminated onto a dicing die bonding film for processing a semiconductor wafer.

Physical properties of the dicing die bonding film were measured as follows, and results are shown in Table 3.

1. Peel Strength with Respect to Bonding Layer (mN/25 mm)

Testing was conducted in accordance with Section 8 of Korean Industrial Standard KS-A-01107. Each 25 mm-wide and 250 mm-long pressure-sensitive adhesive layer was attached to a bonding layer and pressed one time by reciprocating a pressing roller having a weight of 2 kg at a speed of about 300 mm/min thereon. Thirty minutes after pressing, a folded portion of the specimen was turned over 180°, and 25

TABLE 2

|  |  | Example | | | | | | Comparative Example | | | |
|---|---|---|---|---|---|---|---|---|---|---|---|
|  |  | 1 | 2 | 3 | 4 | 5 | 6 | 1 | 2 | 3 | 4 |
| Binder resin | LB-1 | 54.24 | 54.24 | — | — | — | — | — | — | — | — |
|  | LB-2 | — | — | 54.24 | 54.24 | — | — | — | — | — | — |
|  | LB-3 | — | — | — | — | 54.24 | 54.24 | — | — | — | — |
|  | LB-4 | — | — | — | — | — | — | 54.24 | 54.24 | — | — |
|  | LB-5 | — | — | — | — | — | — | — | — | 54.24 | 54.24 |
| Curing agent | L | 3.2 | 3.6 | 3.0 | — | 3.4 | — | 3.0 | — | 2.8 | — |
|  | M | — | — | — | 3.5 | — | 4.0 | — | 3.5 | — | 3.2 |

L: AK-75 (Aekyung Chemical Co., Ltd.)
M: TKA-100 (Asahi Kasei Corporation)

Preparation of Bonding Layer 69 parts by weight of an acrylic rubber binder (SG-P3, Nagase Chemtex, 17%), 13 parts by weight of an epoxy resin (EPPN-501H, Nippon Kayaku, 81%), 7 parts by weight of a phenolic curing agent (HF-1M, Meiwa, 50%), 1 part by weight of a silane additive (KBM-403, Shinetsu, 100%), 0.5 parts by weight of a curing accelerator (TPP-K, HOKKO, 100%), and 9.5 parts by weight of a filler (R-972, Degussa, 100%) were added to a 1 L cylindrical flask, and cyclohexanone was added thereto, thereby preparing an adhesive composition. The adhesive composition was dispersed at 5,000 mm of the specimen was peeled. Then, the specimen was fixed to an upper clip of a tension tester, and the bonding layer was fixed to a lower clip of the tension tester, followed by measuring a load (mN/25 mm) when peeling, while drawing at a tensile speed of about 300 mm/min. An Instron Series IX/s Automated Materials Tester-3343 was used as the tension tester.

2. Peel Strength with Respect to Ring Frame (mN/25 mm)

Peel strength with respect to a ring frame of SUS304 was measured in accordance with Korean Industrial Standard KS-A-01107. The same process was conducted as in measuring the peel strength with respect to the bonding layer except that a ring frame of SUS304 was utilized instead of the die-attach adhesive film.

3. Creep (mm)

The prepared pressure-sensitive adhesive composition was coated to a release side of a polyethylene terephthalate film at a thickness of 8 to 12 μm and dried, followed by aging at 40° C. for 5 days. For evaluation of creep, the specimen was attached to a 1.5 cm×1.5 cm area of a glass substrate and was left at room temperature for 1 day. The pushed distance of the specimen was measured 1 hour after application of 1 kgf to the specimen using a universal test machine (UTM).

4. Tackiness (gf)

The tackiness was measured using a probe tack tester (tacktoc-2000). Pursuant to ASTM D2979-71, the tip of a probe was brought into contact with each of the pressure-sensitive adhesives, which were not UV-cured, at a rate of 10±0.1 mm/sec under a contact load of 9.79±1.01 kPa for 1.0±0.01 sec, followed by separation from the specimen. The maximum force required for separation of the tip from the specimen was defined as the tack value of the specimen.

5. Storage Modulus (kPa)

Each pressure-sensitive adhesive layer was formed into a laminate having a thickness of about 200 μm, which in turn was cut into an 8 mm-diameter circular sample. The storage modulus was measured using an ARES Rheological Scientific Rheometer (TA Instruments). Measurement was conducted at 25 C, a frequency of 10 Hz, and a strain of 10%.

6. Pick-Up Success Rate

A chip pick-up process is a process of mounting chip wafers on a PCB or stacked chips after a dicing process. A pick-up test was conducted on 100 chips at a central portion of a silicon wafer using a die bonder (SDB-10M, Mechatronics), and results are shown in Table 3.

7. Stability of Ring Frame after Dicing

Each dicing die bonding film was diced and evaluated as to stability with respect to a ring frame of SUS304 (O: Excellent stability, □: Average stability, X: Reduced stability).

Examples 1 and 2 were unfavorable for pick-up. The pressure-sensitive adhesive layers according to Comparative Examples 3 and 4 were unfavorable in terms of peel strength and creep property as well as inferior ring frame stability.

By way of summation and review, methods of coating the ring frame in double layers or with anti-UV-curable materials may be considered, but these methods may also require additional processes. Furthermore, a method of differentiating adhesive strength between a pressure-sensitive adhesive layer and a bonding layer from adhesive strength between the pressure-sensitive adhesive layer and the ring frame is proposed. However, this method may involve a great number of processes, thereby decreasing yield while increasing manufacturing costs.

The embodiments may provide a dicing die bonding film that includes a pressure-sensitive adhesive layer having a storage modulus within a predetermined range, thereby enabling elimination of UV irradiation while facilitating pick-up in a die-attach process with secured stable adhesive strength in a ring frame. The embodiments may also provide a dicing die bonding film that does not require an additional process, e.g., coating a ring frame, that secures stable adhesive strength in a ring frame, that facilitates pick-up in a die attach process, and that does not require a UV process in processing a semiconductor wafer, thereby simplifying a process as well as reducing time and costs.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A dicing die bonding film, comprising:
a bonding layer; and

TABLE 3

| | Example | | | | | | Comparative Example | | | |
|---|---|---|---|---|---|---|---|---|---|---|
| | 1 | 2 | 3 | 4 | 5 | 6 | 1 | 2 | 3 | 4 |
| Peel strength with respect to bonding layer (mN/25 mm) | 318 | 213 | 298 | 242 | 285 | 254 | 399 | 374 | 209 | 159 |
| Peel strength with respect to ring frame (mN/25 mm) | 212 | 152 | 198 | 172 | 190 | 172 | 314 | 292 | 142 | 112 |
| Creep (mm) | 0.02 | 0.03 | 0.02 | 0.03 | 0.02 | 0.02 | 0.02 | 0.02 | 0.84 | Detached |
| Tack (before UV exposure) (gf) | 56 | 45 | 54 | 51 | 53 | 51 | 64 | 62 | 35 | 31 |
| Storage modulus at 25° C. (kPa) | 410 | 589 | 570 | 588 | 570 | 583 | 320 | 380 | 621 | 712 |
| Stability of ring frame after dicing | o | o | o | o | o | o | o | o | □ | x |
| Pick up success rate (%) | 100% | 100% | 100% | 100% | 100% | 100% | 60% | 80% | 100% | — |

As shown in Table 3, the pressure-sensitive adhesive layers according to Examples 1 to 6 had a storage modulus of about 400 to 600 kPa at room temperature and a pick-up success rate of 100%, an increase in storage modulus with increasing content of the curing agent, and had low creep property and high peel strength with respect to the ring frame. The pressure-sensitive adhesive layers according to Comparative a pressure-sensitive adhesive layer adjoining the bonding layer, wherein:

the pressure-sensitive adhesive layer includes a binder resin and a heat curing agent, the binder resin is a copolymer of an alkyl (meth)acrylate, a hydroxyl group-containing (meth)acrylate, and an epoxy group-containing (meth)acrylate, and the copolymer includes about 60 to about 85 wt % of repeating units of the alkyl (meth)acrylate, about 10 to about 35 wt % of repeating units of the hydroxyl group-containing meth acrylate and about 1 to about 10 wt % of repeating units of the epoxy group-containin (meth) acrylate.

2. The dicing die bonding film as claimed in claim 1, wherein the pressure-sensitive adhesive layer is formed by heat curing.

3. The dicing die bonding film as claimed in claim 1, wherein the pressure-sensitive adhesive layer does not include a photo-initiator.

4. The dicing die bonding film as claimed in claim 1, wherein the pressure-sensitive adhesive layer further includes a silane coupling agent.

5. The dicing die bonding film as claimed in claim 1, wherein the binder resin has a weight average molecular weight of about 150,000 to about 700,000 g/mol.

6. The dicing die bonding film as claimed in claim 1, wherein the binder resin has a glass transition temperature of about −55 to about −30° C.

7. The dicing die bonding film as claimed in claim 1, wherein the binder resin does not include a vinyl group after polymerization.

8. The dicing die bonding film as claimed in claim 1, wherein the heat curing agent is included in an amount of about 3 to about 10 parts by weight, based on 100 parts by weight of the binder resin.

9. A semiconductor wafer including thereon the dicing die bonding film as claimed in claim 1, the bonding layer of the dicing die bonding film being attached to one side of the wafer, and the pressure-sensitive adhesive layer of the dicing die bonding film being fixed to a wafer ring frame.

10. A semiconductor device, the semiconductor device being formed by:

attaching the dicing die bonding film as claimed in claim 1 to a wafer such that the bonding layer of the dicing die bonding film is attached to the wafer, dicing the wafer into semiconductor chips, and picking up one of the semiconductor chips to form the semiconductor device such that the semiconductor device includes the semiconductor chip mounted on the bonding layer.

11. A dicing die bonding film, comprising:

a bonding layer; and a pressure-sensitive adhesive layer adjoining the bonding layer, the pressure-sensitive adhesive including a copolymer consisting essentially of a C2 to C20 alkyl (meth)acrylate, a hydroxyl group-containing (meth) acrylate, and an epoxy group-containing (meth)acrylate, wherein the copolymer includes about 60 to about 85 wt % of repeating units of the C2 to C20 alkyl (meth)acrylate, about 10 to about 35 wt % of repeating units of the hydroxyl group-containing (meth)acrylate, and about 1 to about 10 wt % of repeating units of the epoxy group-containing (meth)acrylate.

* * * * *